United States Patent [19]

Saeki et al.

[11] Patent Number: 4,743,465
[45] Date of Patent: May 10, 1988

[54] METHOD AND APPARATUS FOR DRAWING THICK FILM CIRCUIT

[75] Inventors: Keiji Saeki; Shinichi Kudo; Hachiro Nakatsuji, all of Osaka, Japan

[73] Assignee: Matsushita Electric Industrial Co., Ltd., Japan

[21] Appl. No.: 817,856

[22] PCT Filed: Apr. 15, 1985

[86] PCT No.: PCT/JP85/00198

§ 371 Date: Feb. 12, 1986

§ 102(e) Date: Feb. 12, 1986

[30] Foreign Application Priority Data

Apr. 17, 1984 [JP] Japan .................. 59-76934

[51] Int. Cl.$^4$ .............................. B05D 5/12
[52] U.S. Cl. ...................... 427/96; 118/70; 118/302; 118/410; 118/411
[58] Field of Search ............ 427/96; 118/302, 410, 118/411, 70; 222/148, 149

[56] References Cited

U.S. PATENT DOCUMENTS 4,515,297  5/1985  Schoenthaler ................ 427/96
4,572,103  2/1986  Engel ........................... 118/410
4,603,655  8/1986  Switall ......................... 118/302

OTHER PUBLICATIONS

Morris Shankin, "WRITE IT, DON'T SCREEN IT!", from 1978 International Microelectronics Symposium of ISHM, Minneapolis, MN, Sep. 17, 1978.
Morris Shankin, "HYBRID CIRCUITS BY COMPUTERIZED WRITING", from Electronic Packaging and Production, Jan. 1981, pp. 98–109.

Primary Examiner—Norman Morgenstern
Assistant Examiner—V. Duong Dang
Attorney, Agent, or Firm—Lowe, Price Leblanc, Becker & Shur

[57] ABSTRACT

A method and apparatus for drawing a thick film circuit on a substrate by discharging a paste from a tank with a discharge hole. A waste drawing is performed by extruding the paste from the tank on a waste drawing section at a predetermined interval of non-drawing duration, thereby preventing paste clogging at the discharge hole and resulting in increase on workability and productivity.

21 Claims, 4 Drawing Sheets

METHOD AND APPARATUS FOR DRAWING THICK FILM CIRCUIT

TECHNICAL FIELD

The present invention relates to a method and apparatus for drawing a thick film circuit wherein a thick film circuit including resistors, capacitors and electric conductors is drawn on a substrate by discharging a paste from a tank with a discharge hole.

BACKGROUND OF THE INVENTION

A thick film circuit is being adapted for use in many types of electronic equipment such as broadcasting radio receivers, television receivers, video tape recorders, communication equipment, and measuring equipment.

A thick film circuit is generally formed using the screen printing method. More specifically, a desired pattern is formed on a substrate made of alumina ceramic using a conductor paste, resistor paste or the like, followed by drying and heating so as to manufacture a thick film circuit. However, the screen printing method uses a mask pattern, with the results that longer time is required for the exchange of the mask pattern, and cleaning of the mask pattern and squeegee, and thus it is unsuitable for small lot production and frequent changes of pattern.

On the other hand, a method, which involves drawing on a moving substrate using a paste directly extruded from a nozzle without employing the mask pattern, is reported by "1978 International Microelectronics Symposium of ISHM, Minneapolis, MN, Sept. 17, 1978" and is introduced by a journal "Electronic Packaging and Production (January, 1981), Pages 98-109".

In operation, a drawing nozzle having a discharge hole for discharging a paste is kept at a certain distance from a substrate and is relatively moved with respect to the substrate to apply the paste withdrawn on a predetermined pattern of a thick film circuit. This drawing method does not require the mast pattern because the thick film circuit is drawn by means of NC control, thereby allowing quick changes in the kind of pattern to instantly modify the circuit.

However, one problem with such a drawing method is that the viscosity of the paste is partially increased due to evaporation of solvent from the paste at the discharge hole during long non-drawing times, that is, the paste is dried, and the increase of the viscosity causes the occurrence of clogging. Therefore, it is required to frequently clean the discharge hole and thus difficulty is encountered to increase workability and productivity.

DISCLOSURE OF THE INVENTION

A primary object of the present invention is therefore to provide a drawing method and apparatus which are capable of preventing a paste from clogging at the discharge hole of a tank.

Another object of the present invention is to provide drawing method and apparatus which are capable of significantly increasing workability and productivity.

These objects of the present invention are achieved by extruding a paste from a tank after a predetermined interval of non-drawing duration for performing waste-drawing on a waste drawing portion.

In a method for drawing a thick film circuit on a substrate by extruding a paste from a tank with a discharge hole according to the present invention, a tape for waste drawing is provided at a place other than the substrate and the paste is discharged from the tank after a predetermined interval of non-drawing duration for performing waste-drawing on the tape, and after the completion of the waste-drawing, the tape is reeled around a reel by a predetermined amount.

Furthermore, an apparatus according to the present invention comprises a tank having a paste therein and a discharge hole, an X-axis drive section and a Y-axis drive section for supporting the tank and for moving the same in a predetermined plane, an up-and-down drive section for moving upwardly and downwardly the tank supported by the X-axis and Y-axis drive sections, and a control section for controlling the discharge of the paste from the discharge hole, the X-axis and Y-axis drive sections and the up-and-down drive section, and is arranged so as to extrude the paste from the tank at a predetermined interval of non-drawing duration under the control of the control section to perform waste-drawing on a waste drawing section.

For example, the waste drawing section comprises a base for positioning a tape for waste-drawing, a supplying reel for supplying the tape, and a reel for reeling the tape. After the completion of waste-drawing, the tape is reeled around a reel by a predetermined amount.

MOST PREFERRED EMBODIMENT OF THE PRESENT INVENTION

Figure 1:
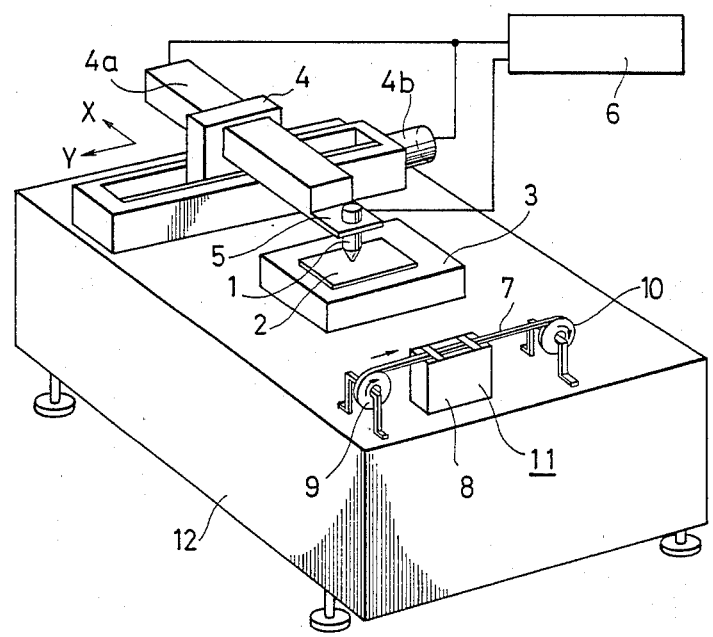
FIG. 1 is a perspective view showing the whole arrangement of a drawing apparatus according to the present invention.

FIG. 1 illustrates the whole arrangement of a drawing apparatus according to an embodiment of the present invention. In the Figure, the reference numeral 1 represents a tank having a paste therein and having a discharge hole at the end thereof, numeral 2 designating a heat-resistant substrate made of alumina ceramic or the like on which a thick film circuit is drawn, numeral 3 depicting a stage for fixedly mounting the substrate, numeral 4 representing a three-axis orthogonal robot comprising an X-axis drive section 4a and a Y-axis drive section 4b for moving the tank 1 in a plane, one end of X-axis drive section 4a being connected to a support plate 5 for supporting the tank 1. The reference numeral 6 designates a control section having a microprocessor therein for controlling the X-axis drive section 4a and Y-axis drive section 4b of the three-axis orthogonal robot, a discharge amount of paste from the discharge hole of the tank 1, and so on. Numeral 11 represents a waste drawing section which comprises a tape 7 for performing the waste drawing, a tape bed plate 8 for mounting the tape 7, a supplying reel 9 for supplying the tape 7, and a reel 10 for reeling the waste-drawn tape 7. The tape 7 is generally made of polyester. The reference numeral 12 designates a base for supporting these parts.

Figure 2:
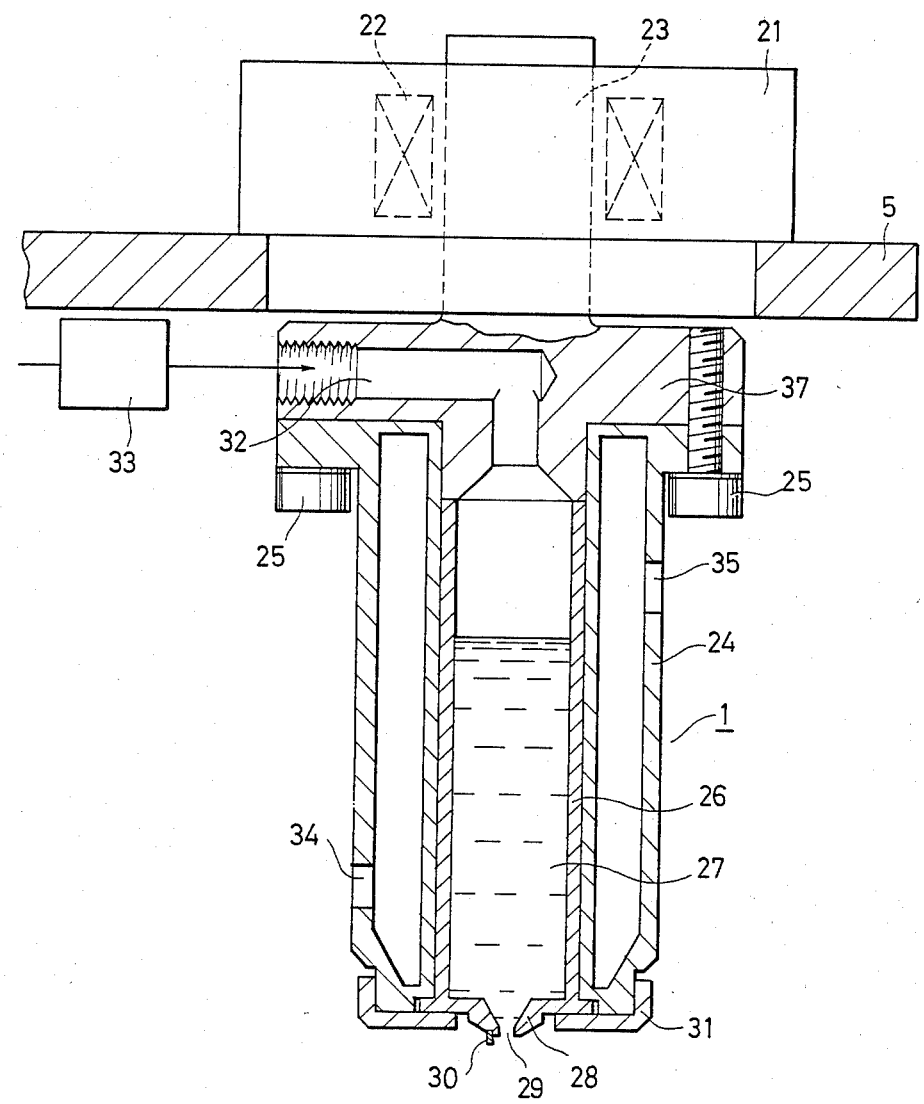
FIG. 2 is a cross-sectional view of the tank of the apparatus of FIG. 1.
Figure 3:
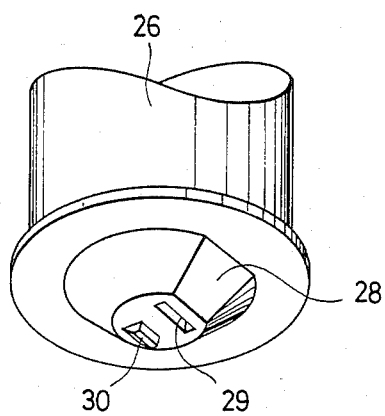
FIG. 3 is a partially perspective view of the paste tank, which is viewed from the bottom thereof.

An arrangement of the tank 1 will be described with reference to FIGS. 2 and 3.

The tank 1 is supported by a support plate 5 which is connected to the X-axis drive section 4a of the three-axis orthogonal robot and an up-and-down drive 21 having a solenoid 22 is provided upwardly of the tank 1. The tank 1 is moved upwardly and downwardly by interaction between a shaft 23 and the solenoid 22. A hot water tank 24 is fixedly secured by a nut 25 to a base 37 provided at the lower end of the shaft 23. This hot water tank 24 has a cylindrical shape, and the center hole thereof is arranged to enable the paste tank 26 shown in FIG. 3 to be accommodated but free to put in and out. The paste tank 26 is filled with the paste 27 for drawing thick film resistors and so on. In a normal condition, it is arranged that the paste 27 does not leaked from a discharge hole 29 (a slit having 100$\mu$ in length and 1 mm in width) of a nozzle portion 28 provided at the end of the tank 24. A diamond stylus 30 having a height of about 40$\mu$ is disposed in the vicinity of the discharge hole 29 of the nozzle portion 28. A ring-shaped cover 31 is disposed at the end portion of the hot water tank 24 and is fixed by screws so that the paste tank 26 is prevented from falling out. An air path 32 for supplying air under pressure is provided in the base 37 of the shaft 23. When an electro-magnetic air valve 33 is opened and air is supplied to the air path 32, the paste is extruded from the discharge hole 29 of the nozzle portion 28. Exchange and supplementation of the paste is achieved by removing the cover 31 and taking out the paste tank. The hot water tank 24 is arranged such that hot water, for example constant-temperature hot water (25° C.±0.2° C.), is added drom an inlet 34 into the tank 24 and is removed from an outlet 35. With the arrangement in which the paste tank 26 is surrounded by the hot water, the paste 27 is maintained at a constant temperature and the viscosity thereof is kept constant, thereby making it possible to constantly control the paste amount from the discharge hole 29 per a given time period.

Figure 4A:
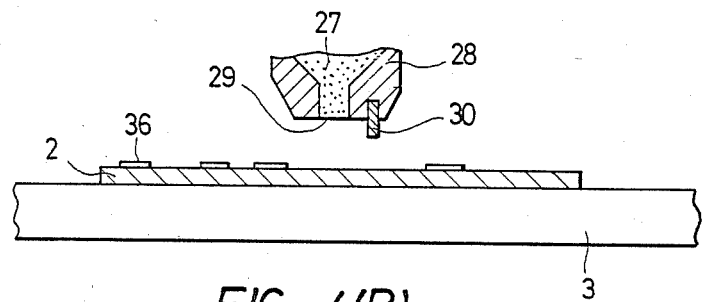
FIGS. 4A and 4B are illustrations useful for describing the drawing by the apparatus of FIG. 1.
Figure 4B:
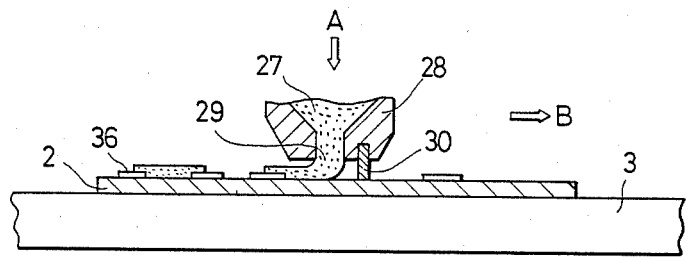

FIGS. 4A and 4B are illustrations for describing the drawing by the above-mentioned apparatus. FIG. 4A shows a state before drawing and FIG. 4B illustrates a drawing state. The reference numeral 36 designates a conductor previously formed on the substrate 2.

In the drawing, the stylus 30 comes into contact with the substrate and thus the distance between the paste tank 28 and the substrate 2 is maintained constant. The paste 27 in the paste tank 28 is extruded in the direction of arrow A by pressurized air supplied through the air path 32 so that it is discharged from the discharge hole 29 on the substrate 2. The tank 2 is moved in the direction of arrow B by the three-axis orthogonal robot 4 to draw a thick film circuit on the substrate 2. After the completion of the drawing, the extrusion in the direction of arrow A is released and the tank 1 is parted from the substrate 2 and returned to the position shown in FIG. 4A.

The thick film circuit drawn on the substrate 2 is dried to evaporate a solvent contained in the paste. For example, in the case of resistor paste, a thick film resistor is formed on the substrate 2 by heating at the temperature of about 850° C.

Figure 5:
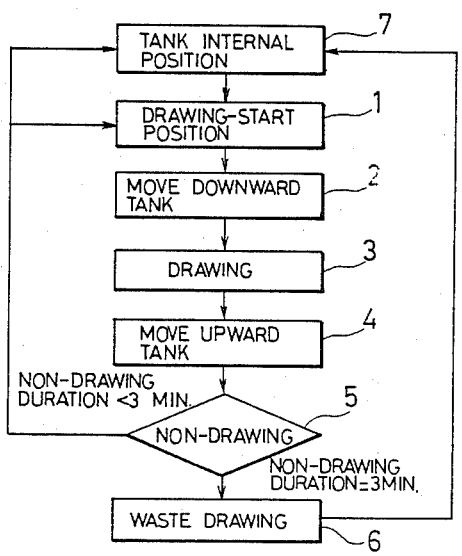
FIGS. 5 is a flow chart representing an operation of the drawing apparatus of FIG. 1.

An operation for drawing a thick film resistor by the above-noted drawing apparatus will be described with reference to the flow chart of FIG. 5.

First, the tank 1 filled with the resistor paste whose principal components are ruthenium oxide powder, resin binder, glass frit and organic solvent is moved to the initial point for drawing by the three-axis orthogonal robot 4 under a control of the control section 6 (step 1), and the tank 1 is moved downward to the substrate 2 (step 2), followed by extruding the paste 27 by pressurized air and horizontally moving the tank 1 to draw (step 3). After the completion of drawing, the tank 1 is moved upward (step 4).

When the apparatus is out of operation because of preparation and adjustment for production, trouble, or the like, taking a long time, the solvent of the paste at the discharge hole of the tank 1 is evaporated, thereby resulting in the occurrence of paste clogging. Therefore, in the embodiment of the present invention, the non-drawing time is measured by the microprocessor encased in the control section 6. Whenever it is elapsed by 3 minutes (step 5), the tank 1 is moved to the waste drawing tape 7 to perform the waste drawing (step 6), thereby preventing the paste clogging. Thereafter, the tank 1 is returned to the initial point (step 7). These succesive operations are performed in accordance with instructions from the micrprocessor provided in the control section 6.

After the completion of the drawing, the waste drawing tape 7 is reeled around a reel 10 by a predetermined amount by means of drive means such as a motor (not shown), and thus non-used tape is set on the tape base 8.

In the above-mentioned embodiment, whenever the non-drawing time is elapsed by 3 minutes, the waste drawing is performed. However, since the waste drawing interval depends upon the kind of paste to be used, the waste drawing interval will be properly set in accordance with the kind of paste. Being other than the substrate, the position of the waste drawing section is not limited. Furthermore, the material of the tape is not limited. For example, it is acceptable to use paper, thin metal plate, resin plate or the like, and it is not necessarily required to use a tape.

INDUSTRIAL APPLICATION

As described above, according to the present invention, since the waste drawing is performed at a predetermined interval, it is possible to prevent the discharge hole of the tank from the paste clogging, resulting in significant increase in workability and productivity.

What is claimed is:

1. A method for drawing a thick film circuit on a substrate by discharging a paste from a tank having a discharge hole, said method including a waste drawing step wherein waste drawing of a portion of the paste from the tank through the discharge hole is performed at a waste drawing section after a predetermined interval of non-drawing of said paste whereby the paste is prevented from clogging the discharge hole, said waste drawing section being disposed at a place other than the substrate and said discharge hole being moved from the substrate to said waste drawing section in response to an elapse of the predetermined interval of non-drawing of the paste.

2. A method as claimed in claim 1, wherein said waste drawing section is disposed at a place other than a stage for said substrate.

3. A method as claimed in claim 1, wherein said predetermined interval is determined in accordance with the type of paste filled in said tank.

4. A method for drawing a thick film circuit on a substrate by discharging a paste from a tank having a discharge hole, said method including a waste drawing step wherein a tape for waste drawing is disposed at a place other than said substrate and waste drawing of a portion of the paste is performed by discharging a portion of said paste from said tank through the discharge hole onto said tape after a predetermined interval of non-drawing of said paste, and after the completion of the waste drawing, a predetermined amount of said tape is reeled around a reel.

5. A method as claimed in claim 4, wherein said predetermined interval is determined in accordance with the type of paste filled in said tank.

6. An apparatus for drawing a thick film circuit on a substrate, comprising a tank having a paste therein and having a discharge hole, an X-axis and Y-axis drive section for supporting and moving said tank in a predetermined plane, an up-and-down drive section for moving upwardly and downwardly said tank supported by said X-axis and Y-axis drive section, and a control section for controlling a discharge of said paste from said discharge hole, said X-axis and Y-axis drive section, and said up-and-down drive section, said control section also controlling a waste drawing operation for discharging a portion of said paste from said tank at a waste drawing section after a predetermined interval of non-drawing of said paste, said waste drawing section being disposed at a place other than said substrate and said control section controlling movement of said discharge hole from said substrate to said waste drawing section in response to an elaspe of the predetermined time interval.

7. An apparatus as claimed in claim 6, wherein said waste drawing section is disposed at a place other than a stage for said substrate.

8. An apparatus as claimed in claim 6, wherein said predetermined interval is determined in accordance with the type of paste filled in said tank.

9. An apparatus as claimed in claim 6, wherein said X-axis and Y-axis drive section comprises a three-axis orthogonal robot.

10. An apparatus as claimed in claim 6, wherein a stylus is provided at an end of said tank to maintain constant a predetermined distance between said substrate and said tank.

11. An apparatus for drawing a thick film circuit on a substrate, comprising a tank having a paste therein and having a discharge hole, an X-axis and Y-axis drive section for supporting and moving said tank in a predetermined plane, an up-and-down drive section for moving upwardly and downwardly said tank supported by said X-axis and Y-axis drive section, and a control section for controlling a discharge of said paste from said discharge hole, said X-axis and Y-axis drive section, and said up-and-down drive section, and further comprising a tape bed plate for mounting a tape for waste drawing, a reel for supplying said tape, and a reel for rolling said tape, said control section also controlling a waste drawing operation for discharging a portion of said paste from said tank onto said tape after a predetermined interval of non-drawing of said paste, and after the completion of the waste drawing, said control section also controlling reeling a predetermined amount of said tape around said rolling reel.

12. An apparatus as claimed in claim 11, wherein said tape bed plate, said supplying reel and said rolling reel are disposed at a place other than a stage for setting said substrate.

13. An apparatus as claimed in claim 11, wherein said predetermined interval is determined in accordance with the type of paste filled in said tank.

14. An apparatus as claimed in claim 11, wherein said waste drawing operation is controlled in accordance with instructions from a microprocessor provided in said control section.

15. An apparatus as claimed in claim 11, wherein said X-axis and Y-axis drive section comprises a three-axis orthogonal robot.

16. An apparatus as claimed in claim 11, wherein a stylus is provided at an end of said tank to maintain constant a predetermined distance between said substrate and said tank.

17. An apparatus as claimed in claim 6, further including pressurized air supply means for extruding the paste from the tank.

18. An apparatus as claimed in claim 11, further comprising pressurized air supply means for extruding the paste from the tank.

19. An apparatus for drawing a thick film circuit on a substrate, comprising a tank having a paste therein and having a discharge hole, an X-axis and Y-axis drive section for supporting and moving said tank in a predetermined plane, and up-and-down drive section for moving upwardly and downwardly said tank supported by said X-axis and Y-axis drive section, and a control section for controlling a discharge of said paste from said discharge hole, said X-axis and Y-axis drive section, and said up-and-down drive section, said control section also controlling a waste drawing operation for discharging a portion of said paste from said tank at a waste drawing section after a predetermined interval of non-drawing of said paste in accordance with instructions from a microprocessor provided in said control section.

20. A method as claimed in claim 1, wherein said waste drawing section is moved by a predetermined amount after completion of the waste drawing.

21. An apparatus as claimed in claim 6, wherein said control section moves the waste drawing section by a predetermined amount after completion of the waste drawing.

* * * * *